US008354047B2

(12) United States Patent
Louh

(10) Patent No.: US 8,354,047 B2
(45) Date of Patent: Jan. 15, 2013

(54) METHOD FOR PRESS MOLDING LENS ARRAY

(75) Inventor: Sei-Ping Louh, Taipei Hsien (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 326 days.

(21) Appl. No.: 12/764,912

(22) Filed: Apr. 21, 2010

(65) Prior Publication Data

US 2010/0301500 A1    Dec. 2, 2010

(30) Foreign Application Priority Data

May 26, 2009  (CN) .......................... 2009 1 0302641

(51) Int. Cl.
*B29D 11/00* (2006.01)
*B29C 43/58* (2006.01)

(52) U.S. Cl. .......... 264/1.1; 264/2.5; 264/2.7; 264/40.1; 264/319; 425/808

(58) Field of Classification Search .................... 264/1.1, 264/2.5, 2.7, 40.1, 319, 320; 425/175, 808
See application file for complete search history.

(56) References Cited

U.S. PATENT DOCUMENTS 6,156,243 A * 12/2000 Kosuga et al. ................. 264/2.5
2005/0093186 A1 * 5/2005 Nystrom et al. ............. 264/1.36

\* cited by examiner

*Primary Examiner* — Mathieu D. Vargot
(74) *Attorney, Agent, or Firm* — Altis Law Group, Inc.

(57) ABSTRACT

A method for press molding a lens array is provided. First, a mold core is provided. The mold core has a first surface having a first alignment formed thereon using a lithography method, and a lens molding surface array and a second alignment formed thereon using an ultra-precision machining method. Then, a substrate is provided. The substrate has a second surface having a third alignment mark formed thereon using the lithography method. The substrate is first aligned with the mold core by aligning the third alignment mark with the first alignment mark, then is further aligned by offsetting the substrate the spacing between the first and second alignment marks to align the center of the substrate with the center of the lens molding surface array. Finally, a molding material is applied on the substrate, then the mold core is applied on the molding material to press mold the lens array.

13 Claims, 5 Drawing Sheets

METHOD FOR PRESS MOLDING LENS ARRAY

BACKGROUND

1. Technical Field

The present disclosure relates to methods for press molding lens arrays.

2. Description of Related Art

Press molding is widely used for making lens arrays. A typical press molding method employs a substrate and a mold core. The mold core has a molding surface array formed thereon, and the molding surface may be concave and convex. After a molding material is applied on the substrate, the mold core is pressed on the molding material, thereby forming a configuration array of lenses each having a surface opposite to the molding surface.

High precision is required in making the lens array, so the substrate is usually required to be precisely aligned with the mold core, where the center of the substrate is aligned with the center of the molding surface array. Currently, the molding surface array is usually made by an ultra-precision machine. As the ultra-precision machining usually only has a precision to about 100 microns, the center of the molding surface array is not identical to the center of the mold core, thus resulting in difficulty of precisely aligning the center of the substrate with the center of the molding surface array.

What is needed, therefore, is a method for press molding a lens array that can overcome the above shortcomings.

BRIEF DESCRIPTION OF THE DRAWINGS

Many aspects of the present method can be better understood with reference to the following drawings. The components in the drawings are not necessarily drawn to scale, the emphasis instead being placed upon clearly illustrating the principles of the present method. Moreover, in the drawings, like reference numerals designate corresponding parts throughout the several views.

DETAILED DESCRIPTION OF THE EMBODIMENTS

Figure 1:
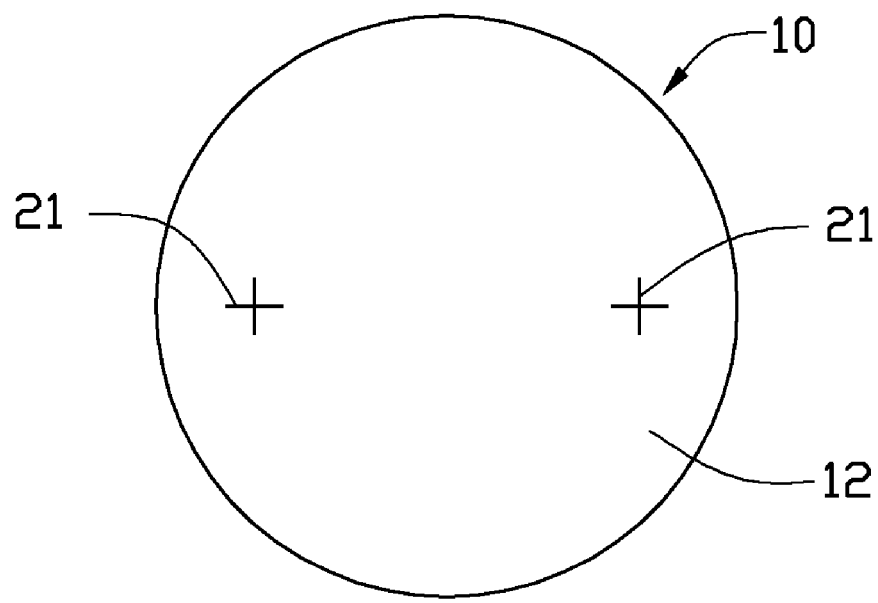
FIG. 1 is a top view of a blank for making a mold core in accordance with a first embodiment, the blank having a first alignment formed thereon.
Figure 2:
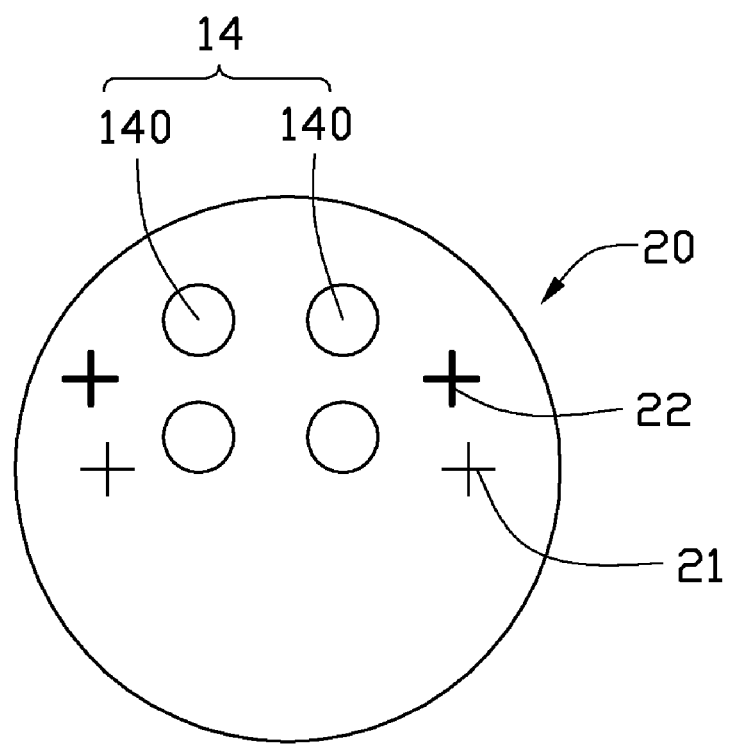
FIG. 2 shows the mold core made from the blank of FIG. 1, the mold core having a molding surface array and a second alignment formed thereon.

Embodiments of the present method will now be described in detail below and with reference to the drawings.

Referring to FIGS. 1 to 4, a method for press molding a lens array in accordance with a first embodiment is provided. The method includes the following steps.

First, a blank 10 is provided. The blank 10 may be made of a metallic material. The blank 10 has a main surface (first surface) 12.

Second, two first alignment marks 21 are formed on the main surface 12 of the blank 10. The first alignment marks 21 are symmetrically about a center of main surface 12, and each are spaced a certain distance from the center of the main surface 12. In the present embodiment, the first alignment marks 21 each are in a substantially cross shape. The first alignment marks 21 are formed using a lithography method. The lithography is carried out in a yellow light clean room, lithography is known for its high precision up to 1 micron. In the present embodiment, the first alignment marks 21 are formed with a line width thereof in a range from about 10 microns to about 30 microns, e.g., 20 microns.

Third, a lens molding surface array 14 is formed on the main surface 12 of the blank 10. In the present embodiment, the lens molding surface array 14 is in the form of a mold cavity array, and includes a plurality of mold cavities 140. The lens molding surface array 14 is made by an ultra-precision machining method. The ultra-precision machining has a precision of about 100 microns.

Fourth, two second alignment marks 22 are formed on the main surface 12 of the blank 10. The second alignment marks 22 each are also a substantially cross shape, and are made by the ultra-precision machining method. The second alignment marks 22 are formed with a line width thereof about 100 microns. The second alignment marks 22 are symmetrically about a center of the lens molding surface array 14, and each are spaced a certain distance from the center of the lens molding surface array 14. In the present embodiment, the distance between the second alignment mark 22 and the center of the lens molding surface array 14 is substantially equal to the distance between the first alignment mark 21 and the center of the main surface 12. After this step, a mold core 20 is finished (see FIG. 2).

Fifth, a spacing between the first alignment mark 21 and the second alignment mark 22 is detected. In this step, a measuring microscope (not shown), which usually has a precision of about 0.6 microns can help measure the precision of the spacing between the first alignment mark 21 and the second alignment mark 22.

Sixth, a substrate 30 is provided. In the present embodiment, the substrate 30 is configured to carry a molding material of the lens array. The substrate 30 may be made of glass. The substrate 30 has a main surface (second surface) 32.

Seventh, two third alignment marks 23 are formed on the main surface 32. The third alignment marks 23 each are also in a substantially cross shape, and are made by the lithography method. The third alignment marks 23 are formed with a line width thereof 1 micron. The third alignment marks 23 are symmetrically about the center of the main surface 32, and each are spaced a certain distance from the center of the main surface 32. The distance between the third alignment mark 23 and the center of the main surface 32 is equal to the distance between the first alignment mark 21 and the center of the main surface 12.

Figure 3:
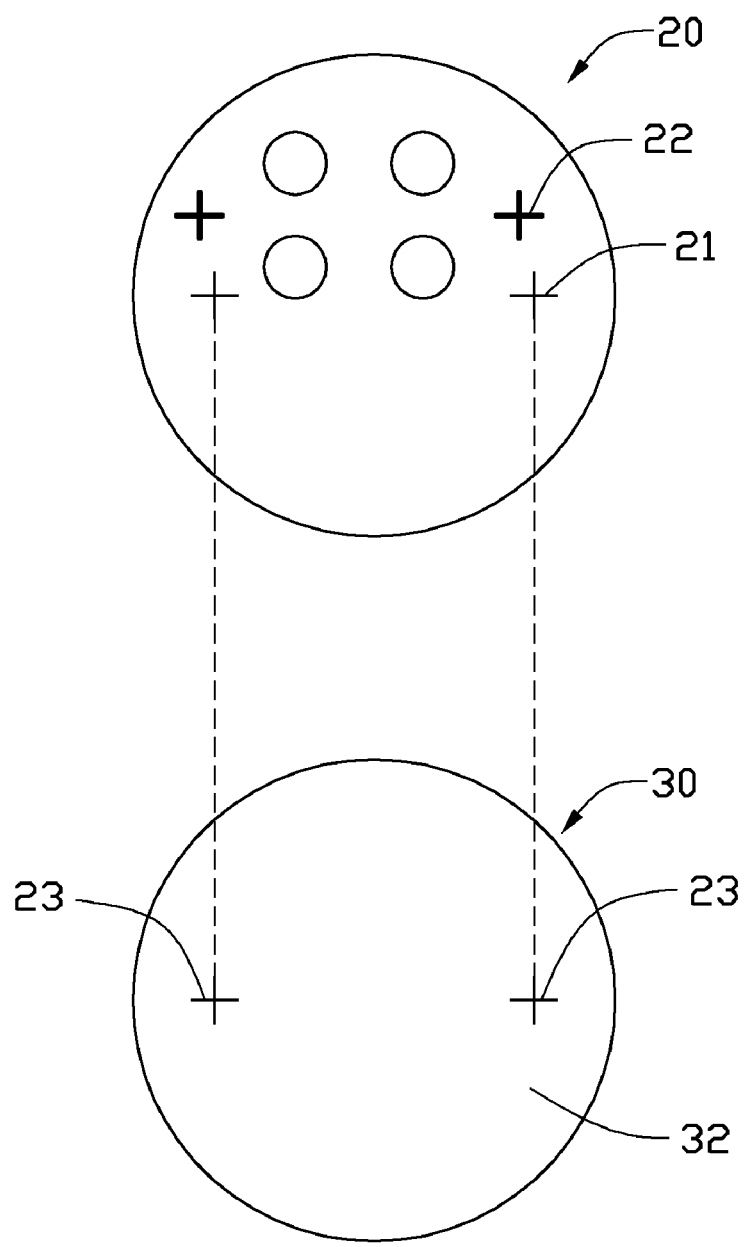
FIG. 3 shows a substrate is provided, the substrate having a third alignment formed thereon.

Eighth, the substrate 30 is first aligned with the mold core 20 by aligning the third alignment marks 23 with the first alignment marks 21 (see FIG. 3).

Figure 4:
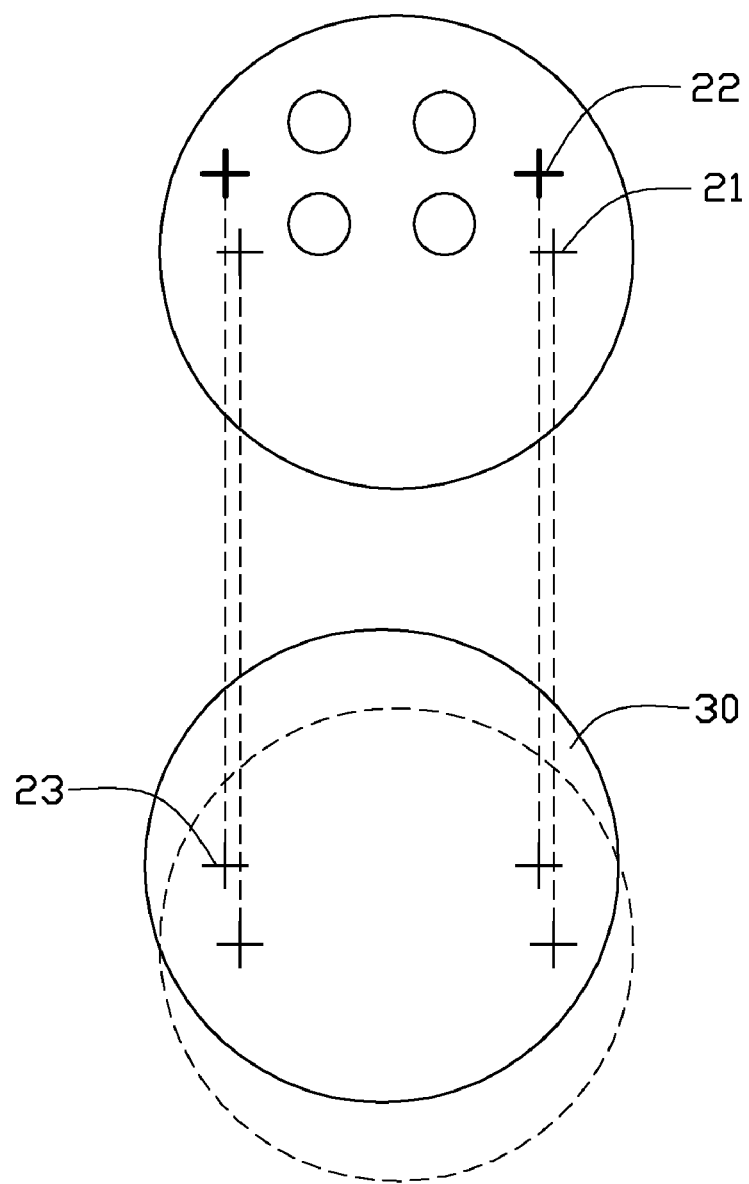
FIG. 4 shows the substrate is offset to align with the mold core.

Ninth, see FIG. 4, the substrate 30 is further aligned with the mold core 20 by offsetting the substrate 30 the spacing between the first alignment mark 21 and the second alignment mark 22 to align the third alignment marks 23 with the second alignment marks 21. In this way, the center of the substrate 30 can be aligned with the center of the lens molding surface array 14.

The first alignment marks 21, second alignment marks 22, third alignment marks 23 have only one scale difference therebetween, therefore, the first alignment marks 21, second alignment marks 22, third alignment marks 23 are able to be precisely aligned with each other. In the alignment process of the first alignment marks 21, second alignment marks 22, and third alignment marks 23, the measuring microscope can give a help.

After the above steps, a molding material can be applied to on the substrate 30, the main surface 32. In alternative embodiments, the mold material can be applied to other surfaces of the substrate 30. Then, the mold core 20 can be pressed on the molding material to form a configuration array of lenses each having a surface opposite to the molding surface.

Figure 5:
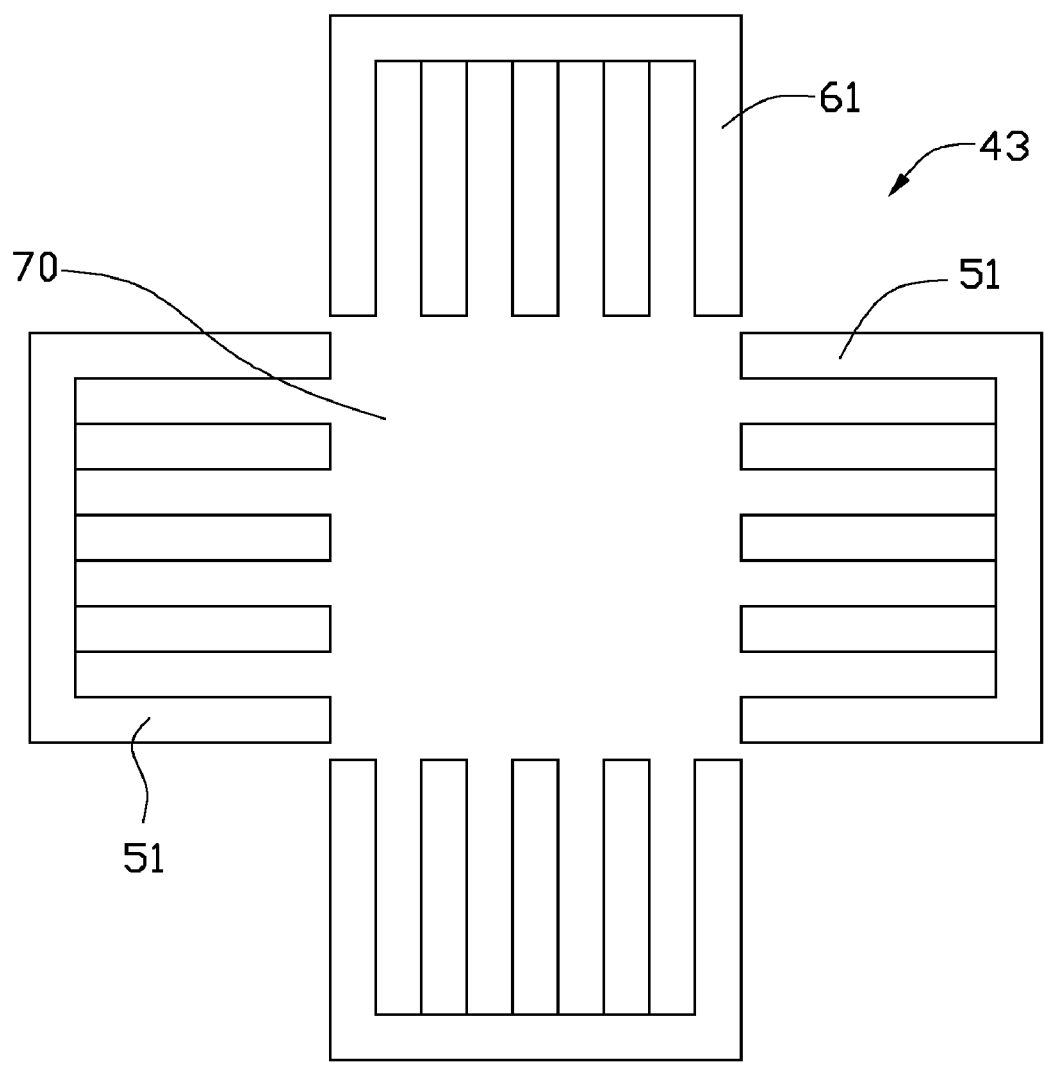
FIG. 5 is a schematic view of a third alignment in accordance with a second embodiment.

Referring to FIG. 5, a third alignment mark 43 which is formed on a substrate (not shown) in accordance with a second embodiment, is provided. The third alignment mark 43 includes a plurality of latitudinal lines 51 and a plurality of longitudinal lines 61 substantially perpendicular to but without intersecting with the latitudinal lines 51. The latitudinal lines 51 are substantially parallel with each other, and two adjacent the latitudinal lines 51 are spaced 1 micron. The longitudinal lines 61 are substantially parallel with each other, and two adjacent longitudinal lines 61 are spaced 1 micron. Line widths of the latitudinal lines 51 and the longitudinal lines 61 each are 1 micron. In the present embodiment, both the plurality of the latitudinal lines 51 and the plurality of the longitudinal lines 61 are odd. With the above configuration, the third alignment mark 43 has a plurality of substantially cross shaped alignment marks. The central area 70 of the third alignment mark 43 is left blank, because two ends of the latitudinal lines 51 and two ends of longitudinal lines 61 are enough in the alignment.

It is understood that the above-described embodiments are intended to illustrate rather than limit the disclosure. Variations may be made to the embodiments and methods without departing from the spirit of the disclosure. Accordingly, it is appropriate that the appended claims be construed broadly and in a manner consistent with the scope of the disclosure.

What is claimed is:

1. A method for press molding a lens array, the method comprising:
   providing a mold core having a first surface, the first surface having a first alignment mark formed thereon using a lithography method, and a lens molding surface array and a second alignment mark formed on the first surface using an ultra-precision machining method, a distance between the first alignment mark and a center of the first surface being equal to a distance between the second alignment mark and a center of the lens molding surface array;
   detecting a spacing between the first alignment mark and the second alignment mark;
   providing a substrate having a second surface, the second surface having a third alignment mark formed thereon using the lithography method, the third alignment mark spaced from a center of the substrate a same distance as the distance between the first alignment mark and the center of the first surface;
   aligning the substrate with the mold core by aligning the third alignment mark with the first alignment mark;
   further aligning the substrate with the mold core by offsetting the substrate the spacing between the first alignment mark and the second alignment mark to align the center of the substrate with the center of the lens molding surface array; and
   applying a mold material on the substrate, and press molding the molding material using the mold core.

2. The method of claim 1, wherein the first alignment mark, the second alignment mark and the third alignment mark each have a cross shape.

3. The method of claim 1, wherein the first alignment mark has a line width in a range from 10 microns to 30 microns, and the third alignment mark has a line width of 1 micron.

4. The method of claim 1, wherein the third alignment mark comprises a plurality of parallel latitudinal lines and a plurality of parallel longitudinal lines perpendicular to but non-intersecting the latitudinal lines, the latitudinal lines each are of 1 micron in width, and are spaced 1 micron from each other, and the longitudinal lines each are of 1 micron in width, and are spaced 1 micron from each other.

5. The method of claim 1, wherein the lithography is carried out in a yellow light clean room.

6. The method of claim 1, wherein the spacing detecting is carried out using a microscope.

7. A method for aligning a substrate with a mold core in press molding, the method comprising:
   providing a mold core having a first surface, the first surface having two first alignment marks formed thereon using a lithography method, and a lens molding surface array and two second alignment marks formed on the first surface using an ultra-precision machining method, the first alignment marks being symmetrical about a center of the first surface, and the second alignment marks being symmetrical about a center of the lens molding surface array;
   detecting a spacing between the first alignment marks and the second alignment marks;
   providing a substrate having a second surface, the second surface having two third alignment marks formed thereon using the lithography method, the third alignment marks being symmetrical about a center of the second surface;
   aligning the substrate with the mold core by aligning the third alignment marks with the first alignment marks; and
   further aligning the substrate with the mold core by offsetting the substrate the spacing between the first alignment marks and the second alignment marks to align the center of the second surface with the center of the lens molding surface array.

8. The method of claim 7, wherein a distance between each of the first alignment marks and the center of the first surface is equal to a distance between each of the second alignment marks and the center of the lens molding surface array.

9. The method of claim 7, wherein each of the first alignment marks, the second alignment marks and the third alignment marks has a cross shape.

10. The method of claim 9, wherein each of the first alignment marks has a line width in a range from 10 microns to 30 microns, and each of the third alignment marks has a line width of 1 micron.

11. The method of claim 7, wherein each of the third alignment marks comprises a plurality of parallel latitudinal lines and a plurality of parallel longitudinal lines perpendicular to but non-intersecting the latitudinal lines, the latitudinal lines each are of 1 micron in width, and are spaced 1 micron from each other, and the longitudinal lines each are of 1 micron in width, and are spaced 1 micron from each other.

12. The method of claim 7, wherein the lithography is carried out in a yellow light clean room.

13. The method of claim 7, wherein the spacing detecting is carried out using a microscope.

* * * * *